United States Patent
Numasawa et al.

(10) Patent No.: US 11,251,571 B2
(45) Date of Patent: Feb. 15, 2022

(54) IMAGE FORMING APPARATUS HAVING A CONTROL BOARD ATTACHED TO A SUPPORT MEMBER

(71) Applicant: CANON KABUSHIKI KAISHA, Tokyo (JP)

(72) Inventors: Tatsuya Numasawa, Kashiwa (JP); Tadahiro Sako, Toride (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 10 days.

(21) Appl. No.: 16/883,133

(22) Filed: May 26, 2020

(65) Prior Publication Data

US 2020/0381873 A1  Dec. 3, 2020

(30) Foreign Application Priority Data

Jun. 3, 2019 (JP) .............................. JP2019-103501

(51) Int. Cl.
| | |
|---|---|
| *G03G 15/00* | (2006.01) |
| *H01R 13/6594* | (2011.01) |
| *H01R 13/659* | (2011.01) |
| *H05K 9/00* | (2006.01) |
| *G03G 21/16* | (2006.01) |

(52) U.S. Cl.
CPC ......... *H01R 13/6594* (2013.01); *G03G 15/80* (2013.01); *G03G 21/1647* (2013.01); *G03G 21/1652* (2013.01); *H01R 13/659* (2013.01); *H05K 9/0058* (2013.01)

(58) Field of Classification Search
CPC ............... G03G 15/80; G03G 21/1647; G03G 21/1652; H01R 13/659; H01R 13/6594; H05K 9/0058
See application file for complete search history.

(56) References Cited

U.S. PATENT DOCUMENTS

| | | | | |
|---|---|---|---|---|
| 4,899,182 A | * | 2/1990 | Inoue ..................... | G03G 15/80 346/145 |
| 2011/0051377 A1 | * | 3/2011 | Fukushima ........ | G03G 21/1652 361/748 |
| 2014/0212151 A1 | * | 7/2014 | Oda .................... | G03G 21/1652 399/12 |
| 2015/0063863 A1 | * | 3/2015 | Koyanagi .......... | G03G 21/1652 399/107 |

(Continued)

FOREIGN PATENT DOCUMENTS

| | | |
|---|---|---|
| JP | 2009-291042 | 12/2009 |
| JP | 2017-44986 | 3/2017 |

*Primary Examiner* — Sophia S Chen
(74) *Attorney, Agent, or Firm* — Venable LLP

(57) ABSTRACT

An image forming apparatus includes an image forming unit configured to form an image on a recording material; a fixing unit configured to heat the image in order to fix the image to the recording material; a control board; a support member, wherein the control board is attached to the support member; and a mounting portion, wherein the support member is attached to the mounting portion. The support member includes a side wall. A height of the side wall is smaller than twice a distance between the side wall and the connector on the control board under a state in which the control board is attached to the support member, and is larger than a height from a bottom surface of the support member to an upper surface of the control board.

9 Claims, 6 Drawing Sheets

(56) References Cited

U.S. PATENT DOCUMENTS

2016/0381815 A1* 12/2016 Terakawa ............... G03G 15/80
361/809
2018/0103542 A1* 4/2018 Shinotsuka ............ G03G 15/80
2020/0273498 A1* 8/2020 Wakayama ........ G03G 21/1647

* cited by examiner

IMAGE FORMING APPARATUS HAVING A CONTROL BOARD ATTACHED TO A SUPPORT MEMBER

BACKGROUND OF THE INVENTION

Field of the Invention

The present disclosure relates to an image forming apparatus to which a control board attached to a support member is to be mounted.

Description of the Related Art

An image forming apparatus is configured by combining various units for image formation. The image forming apparatus also includes a control board for controlling an operation of each of the units. The control board is attached to a support member to be incorporated into the image forming apparatus. The support member disclosed in Japanese Patent Application Laid-open No. 2009-291042 has a configuration in which side walls are provided in its periphery to prevent contact between the control board and another unit, which is likely to occur at the time of being incorporated into an apparatus. The support member disclosed in Japanese Patent Application Laid-open No. 2017-44986 has a part to be used as a fixing portion for fixing a fan duct. This configuration is effective for space saving of an apparatus.

With a related-art support member, which is provided with side walls, it is possible to prevent the control board from being brought into contact with another unit at the time of being incorporated into an apparatus. However, in a case where a connector of a cable is inserted into a connector of the control board that has been incorporated into the apparatus, there is a possibility that a worker's hand or an automatic machine may interfere with one of the side walls of the support member. For this reason, the side walls of the support member cause deterioration in workability of insertion and removal of the connector. Therefore, the present disclosure has an object to easily insert or remove a connector into/from a control board mounted to a support member while preventing the control board from hitting an apparatus main body during mounting work of mounting the control board to the apparatus main body.

SUMMARY OF THE INVENTION

An image forming apparatus, according to the present disclosure includes: an image forming unit configured to form an image on a recording material; a fixing unit configured to fix the image to the recording material; a control board configured to electrically connect to the fixing unit via a connector; a support member, wherein the control board is attached to the support member; and a mounting portion, wherein the support member is attached to the mounting portion, wherein the support member includes a side wall, and wherein a height of the side wall is: smaller than twice a distance between the side wall and the connector on the control board under a state in which the control board is attached to the support member; larger than a first height, which is a height from a bottom surface of the support member to an upper surface of the control board, and smaller than a second height obtained by adding a height of the connector to the first height.

Further features of the present invention will become apparent from the following description of exemplary embodiments (with reference to the attached drawings).

DESCRIPTION OF THE EMBODIMENTS

At least one embodiment of the present disclosure is described with reference to the accompanying drawings.

Apparatus Configuration

Figure 1:
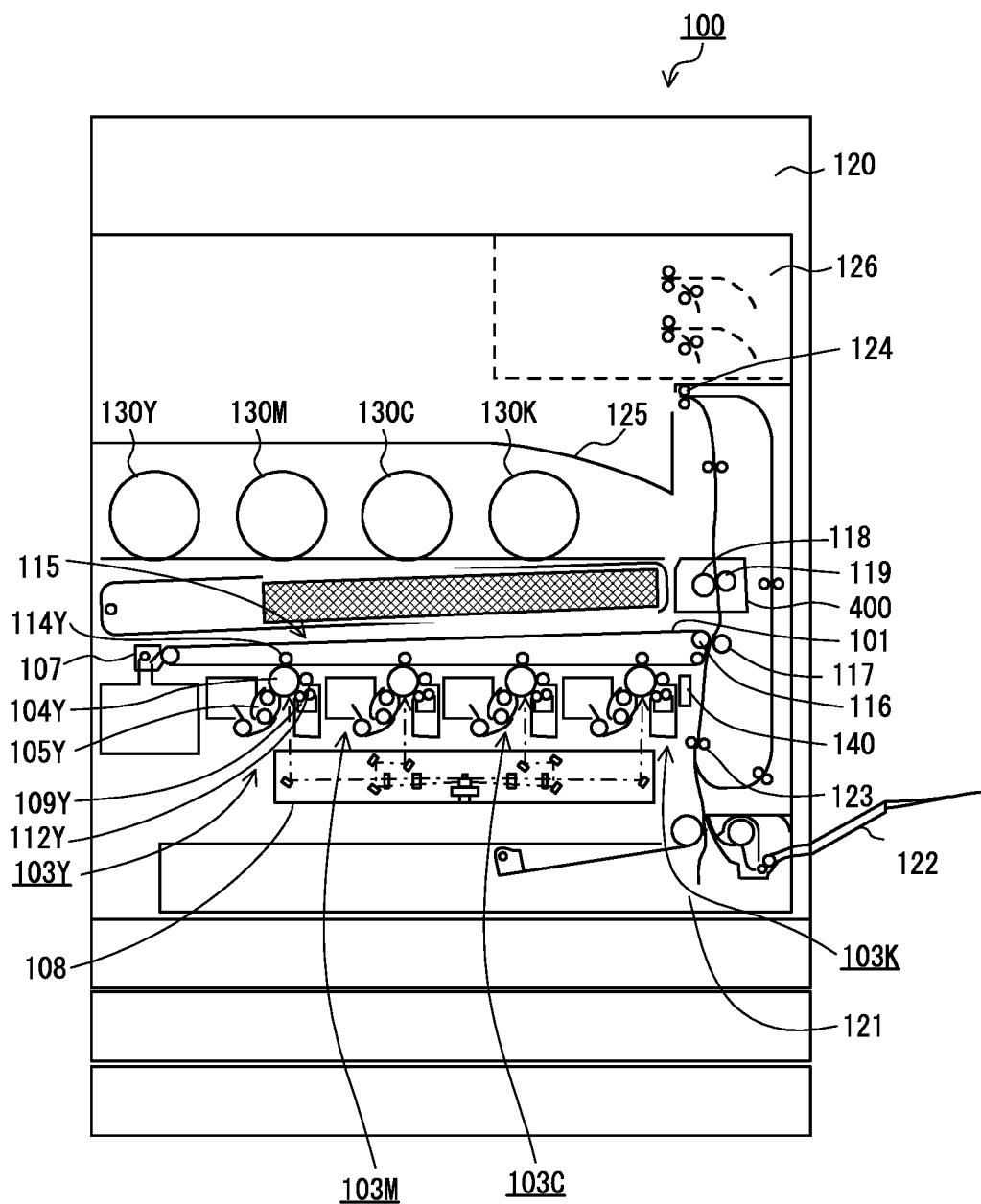
FIG. 1 is a view for illustrating a configuration of an image forming apparatus according to at least one embodiment of the present disclosure.

FIG. 1 is a view for illustrating a configuration of an image forming apparatus being an example of an apparatus into which a control board is to be incorporated by a support member according to at least one embodiment. An image forming apparatus 100 is an electrophotographic full-color image forming apparatus configured to form an image on a recording material. The image forming apparatus 100 includes toner containers 130Y, 130M, 130C, and 130K, each of which contains replenishing developer (hereinafter referred to as "toner"). The toner containers 130Y, 130M, 130C, and 130K are removably mounted to a main body (casing) of the image forming apparatus 100. The image forming apparatus 100 includes an image reading apparatus 120 configured to read an image of an original, and a user interface (UI) 126 configured to receive an instruction given by a user, and to provide the user with information.

The image forming apparatus 100 includes four image forming units 103Y, 103M, 103C, and 103K arranged at regular intervals. The image forming units 103Y, 103M, 103C, and 103K are removably mounted to the main body of the image forming apparatus 100. The image forming units 103Y, 103M, 103C, and 103K are configured to form images of different colors. The image forming apparatus 100 includes a laser exposure device 108 for use during image formation by the image forming units 103Y, 103M, 103C, and 103K. The image forming apparatus 100 includes an intermediate transfer belt unit 115 including an intermediate transfer belt 101 on which an image is transferred from each of the image forming units 103Y, 103M, 103C, and 103K. The image forming apparatus 100 includes a secondary transfer unit configured to transfer the images on the intermediate transfer belt 101 onto the recording material, and a fixing unit 400 configured to fix the images to the recording material.

The image forming units 103Y, 103M, 103C, and 103K differ only in color of an image to be formed, and have the same configuration and execute the same processing. The image forming unit 103Y forms an image in yellow. The image forming unit 103M forms an image in magenta. The image forming unit 103C forms an image in cyan. The image forming unit 103K forms an image in black. In this example, only the configuration and processing of the image forming unit 103Y are described, and a description of the configuration and processing of the image forming units 103M, 103C, and 103K is omitted.

The image forming unit 103Y includes a drum-type photosensitive member (hereinafter referred to as "photosensitive drum") 104Y as an image bearing member. In the periphery of the photosensitive drum 104Y, a charging device 109Y, a developing device 105Y, and a drum cleaner 112Y are provided. At an opposite position to the photosensitive drum 104Y across the intermediate transfer belt 101, a primary transfer roller 114Y is provided.

The photosensitive drum 104Y has, on its aluminum-made drum base, a photoconductive layer formed from a negatively-charged OPC. The photosensitive drum 104Y is rotated at a predetermined speed by a drive motor (not shown). The charging device 109Y is configured to uniformly charge the surface of the photosensitive drum 104Y to a predetermined negative potential through use of a charging bias applied by a high-voltage unit to be described later.

The laser exposure device 108 includes a light emitting unit configured to emit laser light controlled in accordance with time-series electric digital pixel signals (hereinafter referred to as "image data") indicating an image to be formed. The laser exposure device 108 is configured to expose the charged surface of the photosensitive drum 104 to laser light, to thereby form an electrostatic latent image corresponding to the image data on the surface of the photosensitive drum 104. In this example, a yellow electrostatic latent image is formed based on yellow image data. The developing device 105Y contains toner. The developing device 105Y is configured to cause the toner (in this example, yellow toner) to adhere to the electrostatic latent image formed on the photosensitive drum 104Y, to thereby develop the electrostatic latent image as a toner image (form a visible image). The primary transfer roller 114Y is biased toward the photosensitive drum 104Y side so that the primary transfer roller 114Y presses the intermediate transfer belt 101. The primary transfer roller 114Y is configured to transfer the yellow toner image formed on the photosensitive drum 104Y onto the intermediate transfer belt 101. The drum cleaner 112Y is configured to remove, after the transfer, transfer residual toner remaining on the photosensitive drum 104Y therefrom. For that purpose, the drum cleaner 112Y includes a cleaning blade, for example.

The image forming units 103M, 103C, and 103K are similarly configured to form a toner image and transfer the toner image onto the intermediate transfer belt 101. As described later, the intermediate transfer belt 101 rotates. The image forming units 103Y, 103M, 103C, and 103K transfer toner images of different colors in a superimposed way on the intermediate transfer belt 101 at a corresponding timing in accordance with the rotation of the intermediate transfer belt 101. With this operation, a full-color toner image is formed on the intermediate transfer belt 101.

The intermediate transfer belt unit 115 includes a drive roller 116 also serving as a secondary transfer opposing roller, and a gear on a drive roller shaft (not shown). The intermediate transfer belt 101 is rotated by the drive roller 116, the gear on the drive roller shaft, and a drive gear (also not shown) on the main body. A secondary transfer roller 117 is provided opposite to the drive roller 116 across the intermediate transfer belt 101. The drive roller 116 and the secondary transfer roller 117 form a secondary transfer unit. The secondary transfer unit is configured to convey the recording material while nipping the recording material and the intermediate transfer belt 101 between the drive roller 116 and the secondary transfer roller 117, to thereby transfer the toner images on the intermediate transfer belt 101 onto the recording material.

An optical sensor 140 is provided downstream of the image forming unit 103K and upstream of the secondary transfer unit in the rotation direction of the intermediate transfer belt 101. The optical sensor 140 is configured to read an image for measurement formed on the intermediate transfer belt 101 at the time of, for example, image density correction or color misregistration correction.

The fixing unit 400 is provided downstream of the secondary transfer roller 117 in a conveyance direction of the recording material. The fixing unit 400 includes a fixing roller 118 and a pressure roller 119. The fixing roller 118 is heated by a fixing heater described below. The fixing unit 400 is configured to apply heat and pressure to the recording material having transferred thereonto the toner image, through use of the fixing roller 118 and the pressure roller 119, so as to fix the image to the recording material. The recording material is a sheet-like recording medium to be fed from a sheet feeding cassette 121 or a manual feed tray 122. On a conveyance path for feeding the recording material, at least registration rollers 123 and delivery rollers 124 are provided. The registration rollers 123 serve to convey the recording material to the secondary transfer unit. The delivery rollers 124 serve to discharge to a discharge tray 125 the recording material having the image formed thereon. The registration rollers 123 are configured to correct, for example, skew of the recording material, and convey the recording material to the secondary transfer unit in accordance with a timing at which the toner image formed on the intermediate transfer belt 101 is conveyed to the secondary transfer unit.

The image forming apparatus 100 having the above-mentioned configuration performs image forming processing as follows in response to an instruction to form an image, which is given by a user with the UI 126. In this example, a description is given of copying processing for forming on the recording material an image of the original read by the image reading apparatus 120. With regard to the image forming units 103Y, 103M, 103C, and 103K, Y, M, C, and K suffixed to respective reference symbols are omitted in a case where color identification is not required in the following description. With regard to each photosensitive drum 104 or other components as well, Y suffixed to reference symbols is omitted in the following description.

When receiving the instruction to form an image (to execute copying processing), the image forming apparatus 100 causes the image reading apparatus 120 to read an image of the original. The image reading apparatus 120 generates image data indicating the read image and then transmits the data to the image forming apparatus 100. The image data is generated for each color, that is, yellow, magenta, cyan, and black. When operating as a printer, the image forming apparatus 100 may obtain image data from an external device, such as a personal computer or a portable memory, to form an image.

The photosensitive drum 104 of the image forming unit 103 is rotated at a predetermined speed, and its surface is negatively charged uniformly by the charging device 109. The laser exposure device 108 irradiates the photosensitive drum 104 with laser light modulated in accordance with the image data, to thereby form an electrostatic latent image on the photosensitive drum 104. The developing device 105 causes toner to adhere onto the electrostatic latent image formed on the photosensitive drum 104 through application of a developing bias having the same polarity as the polarity (negative polarity) of the charged photosensitive drum 104, to thereby form a toner image as a visible image. The toner image is transferred onto the rotationally driven intermediate transfer belt 101 by the photosensitive drum 104 and the primary transfer roller 114 applied with a primary transfer bias (opposite polarity (positive polarity) to that of the toner). On the intermediate transfer belt 101, the toner images of different colors, that is, yellow, magenta, cyan, and black are successively transferred in a superimposed way. The transfer residual toner remaining on the photosensitive drum 104 is scraped off by, for example, a cleaner blade provided in each drum cleaner 112, and collected.

The full-color toner image on the intermediate transfer belt 101 is conveyed to the secondary transfer unit by the rotation of the intermediate transfer belt 101. In synchronization with a timing at which a tip end of each of the conveyed toner images reaches the transfer unit, the recording material fed from the sheet feeding cassette 121 or the manual feed tray 122 is conveyed by the registration rollers 123 to the secondary transfer unit. On the recording material conveyed to the secondary transfer unit, the full-color toner image on the intermediate transfer belt 101 is collectively transferred by the secondary transfer roller 117 applied with a secondary transfer bias (opposite polarity (positive polarity) to that of the toner). After the transfer, residual toner remaining on the intermediate transfer belt 101 is scraped off by a transfer cleaner 107, and collected as waste toner.

The recording material having formed thereon the full-color toner image is conveyed to the fixing unit 400, and at a fixing nip portion between the fixing roller 118 and the pressure roller 119, heat and pressure are applied to the recording material having the full-color toner image formed thereon. As a result, the image is thermally fixed to the surface of the recording material. The recording material is discharged by the delivery rollers 124 onto the discharge tray 125 provided at an upper surface of the main body. Through the above-mentioned operations, a series of procedures of image forming processing (copying processing) is completed.

Control Board

Figure 2:
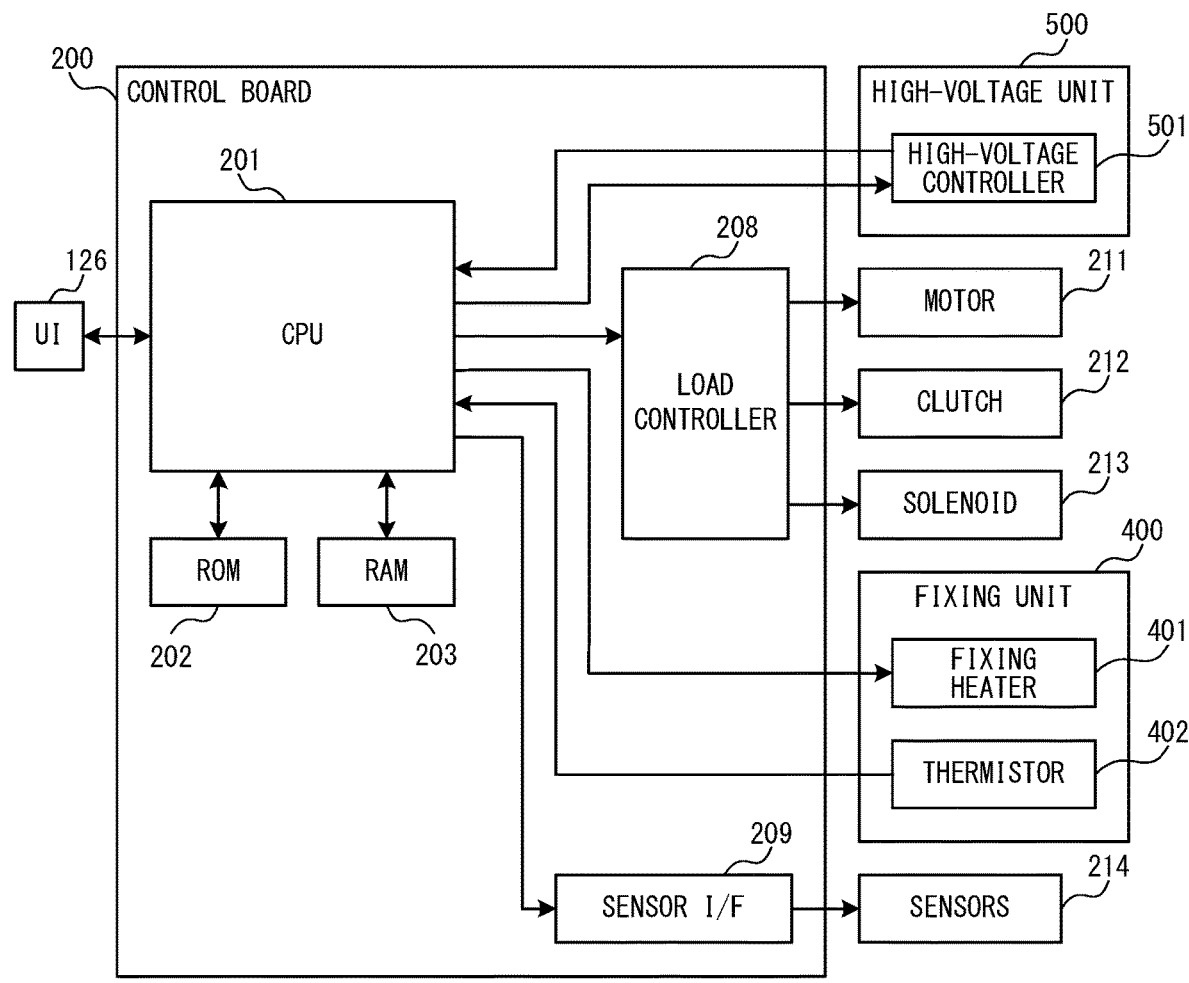
FIG. 2 is an explanatory diagram of a control board.

FIG. 2 is an explanatory diagram of a control board configured to control an operation of the image forming apparatus 100. A control board 200 is a controller configured to centrally control the operation of the image forming apparatus 100 to convey a recording material, form, transfer, and fix an image, and perform other such processing. To that end, the control board 200 drives each load included in the image forming apparatus 100, collects and analyzes information through use of sensors, and exchanges data with the UI 126. The control board 200 is connected to the UI 126, a high-voltage unit 500, a motor 211, a clutch 212, a solenoid 213, the fixing unit 400, and sensors 214. The motor 211 is a drive source for rotating the photosensitive drum 104Y. The high-voltage unit 500 includes a high-voltage controller 501. The high-voltage controller 501 controls the generation of a high voltage to be used by, for example, the charging device 109, and the application of the high voltage by the charging device 109. The fixing unit 400 includes a fixing heater 401 and a thermistor 402.

The control board 200 includes a central processing unit (CPU) 201, a read only memory (ROM) 202, and a random access memory (RAM) 203. The CPU 201 uses the RAM 203 as a work area to execute a computer program stored in the ROM 202, to thereby control the operation of the image forming apparatus 100. Meanwhile, the ROM 202 stores, for example, a high-voltage set value for the high-voltage controller 501, various kinds of data, and information input from the UI 126.

As described above, the UI 126 is configured to receive an instruction from a user and provide information to the user. For example, the UI 126 receives a copy magnification, a density set value, and other such information set by the user. The UI 126 also outputs information for presenting to the user a state of the image forming apparatus 100, for example, the number of images to be formed, a status of whether or not an image is being formed, an occurrence of a jam, and a location thereof.

The DC loads including the motor 211, the clutch 212, and the solenoid 213 and the sensors 214 including a photo interrupter and a microswitch are arranged at various places inside the image forming apparatus 100. When the motor 211 is driven while the clutch 212 and the solenoid 213 are appropriately driven, a recording material is conveyed and each unit is driven. The sensors 214 are used for monitoring the conveyance of a recording material and the driving of each unit.

The control board 200 includes a load controller 208 configured to control the driving of the motor 211, the clutch 212, and the solenoid 213. The control board 200 also includes a sensor interface (I/F) 209 configured to obtain a detection result (detection signal) from each of the sensors 214 and transmit the detection result to the CPU 201. The CPU 201 controls the driving of the motor 211, the clutch 212, and the solenoid 213 by the load controller 208 based on the detection results (detection signals) obtained from the sensors 214. Through the control of the driving of the motor 211, the clutch 212, and the solenoid 213, operations of an image forming motor unit and a toner supply motor unit are controlled. The image forming motor unit is configured to drive the photosensitive drum 104, the intermediate transfer belt 101, and other such components. The toner supply motor unit is configured to drive the toner containers 130Y, 130M, 130C, and 130K.

The CPU 201 transmits various high-voltage control signals to the high-voltage controller 501 of the high-voltage unit 500. The high-voltage controller 501 causes, for example, the charging device 109 to apply an appropriate high voltage. The CPU 201 controls power supply to the fixing heater 401 included in the fixing unit 400. The thermistor 402 is configured to measure a temperature inside the fixing unit 400. The CPU 201 monitors the temperature inside the fixing unit 400 through use of the thermistor 402, and controls an amount of power being supplied to the fixing heater 401 based on the temperature, to thereby control the temperature in the fixing unit 400.

Arrangement of Control Board

Figure 3:
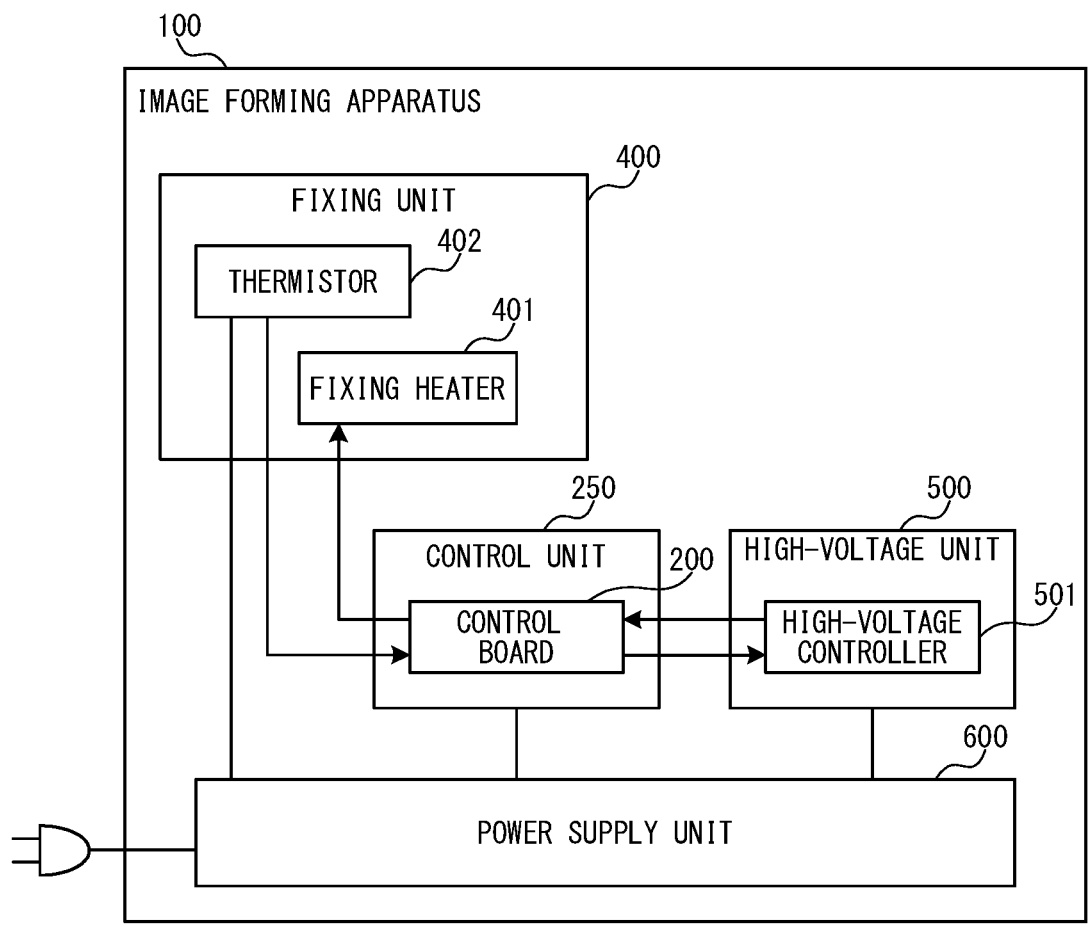
FIG. 3 is a diagram for illustrating an arrangement of respective units.

FIG. 3 is a diagram for illustrating an arrangement of the respective units in the image forming apparatus 100. FIG. 3 is a back view of the image forming apparatus 100 in a case where FIG. 1 is assumed to be a front view of the image forming apparatus 100. The image forming apparatus 100 includes a control unit 250, the high-voltage unit 500, the fixing unit 400, and a power supply unit 600. The power supply unit 600 converts power supplied from a commercial power supply into an internal voltage to be used by each unit included in the image forming apparatus 100. The power supply unit 600 supplies the internal voltage to each unit included in the image forming apparatus 100. The control unit 250 includes the control board 200.

The power supply unit 600 is provided at the lowermost part of the image forming apparatus 100. The control unit 250 and the high-voltage unit 500 are provided immediately above the power supply unit 600. The control unit 250 and the high-voltage unit 500 are arranged side by side in the horizontal direction. The fixing unit 400 is provided above the control unit 250. The control unit 250 is provided between the fixing unit 400 and the high-voltage unit 500 in order to control operations of the fixing unit 400 and the high-voltage unit 500.

Support Member

Figure 4:
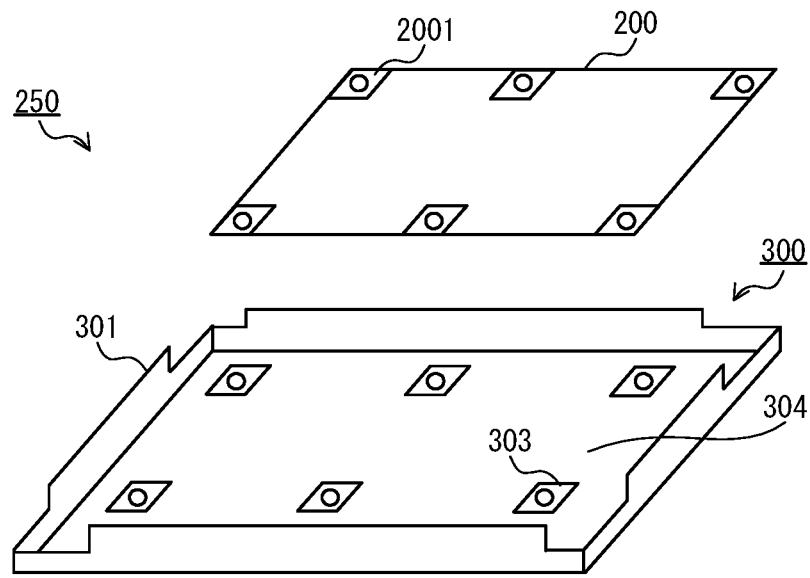
FIG. 4 is an explanatory view of a control unit.

FIG. 4 is an explanatory view of the control unit 250. The control unit 250 has a configuration in which the control board 200 is attached to a support member 300. The control board 200 is attached and fixed to the support member 300, and is then mounted to or incorporated into the image forming apparatus 100.

The support member 300 is made of a single metal plate, and includes an attachment surface 304 and at least one board support portion 303 for fixing the control board 200. In addition, the support member 300 has side walls 301 formed by bending the metal plate at its end portions. For example, the support member 300 may be injection-molded through use of a resin. The attachment surface 304 serves as a surface for placing the control board 200. The attachment surface 304 is formed in a shape corresponding to the shape of the control board 200. The board support portion 303 is provided at a position corresponding to a position of an attachment portion 2001 on the control board 200 side, and the number of board support portions 303 corresponds to the number of attachment portions 2001. The side wall 301 is a protective member for preventing an end portion of the control board 200 from being brought into contact with another unit (for example, the power supply unit 600 or the high-voltage unit 500) adjacent thereto when the control unit 250 is mounted to the image forming apparatus 100. The side walls 301 in at least one embodiment are provided so as to surround the control board 200 placed on the attachment surface 304, but there may be a side on which no side wall is formed depending on a situation around the position at which the control board 200 is incorporated. That is, the side wall 301 is not limited to being formed so as to surround four sides of the control board 200 placed on the attachment surface 304. The side wall 301 is only required to be provided on at least a part of the four sides of the control board 200 placed on the attachment surface 304. In addition, the heights of the side walls 301 are not required to be all the same, and may be appropriately determined depending on another unit adjacent thereto.

Figure 5:
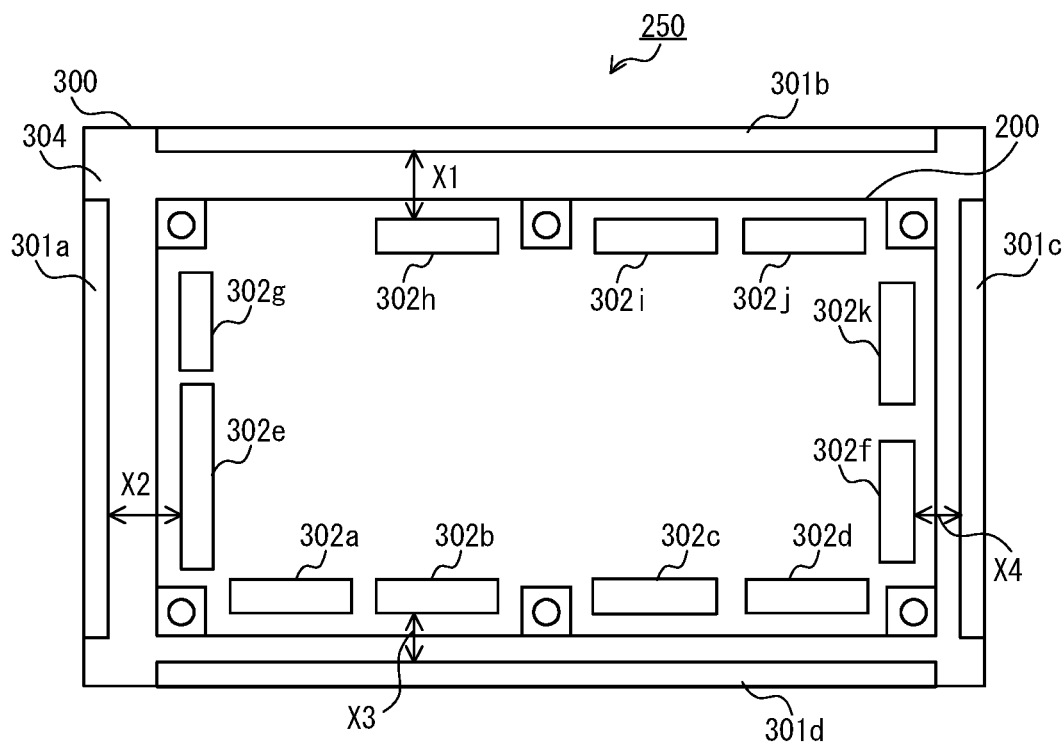
FIG. 5 is a view for illustrating a configuration of the control unit.

FIG. 5 is a view for illustrating a configuration of the control unit 250 in a state in which the control board 200 is attached to the support member 300. Various electronic components are mounted to the control board 200. The electronic components include, for example, a connector. The control board 200 has connectors 302a to 302k mounted near the end portions. Connectors of cables for electrically connecting another unit (power supply unit 600, fixing unit 400, or high-voltage unit 500) to the control board 200 are inserted into or removed from the connectors 302a to 302k. For example, the connector of the cable for electrically connecting the motor 211, which is illustrated in FIG. 2, to the control board 200 is inserted into the connector 302a. Further, for example, the connector of the cable for electrically connecting the fixing heater 401 and the thermistor 402, which are illustrated in FIG. 2 and FIG. 3, to the control board 200 is inserted into the connector 302h. The attachment portion 2001 of the control board 200 is fixed to the board support portion 303 with a screw. Side walls 301a to 301d of the support member 300 are configured to cover the periphery of the attached control board 200. A distance from the connectors 302h to 302j to the side wall 301b is X1. A distance from the connectors 302e and 302g to the side wall 301a is X2. A distance from the connectors 302a to 302d to the side wall 301d is X3. A distance from the connectors 302f and 302k to the side wall 301c is X4.

Figure 6:
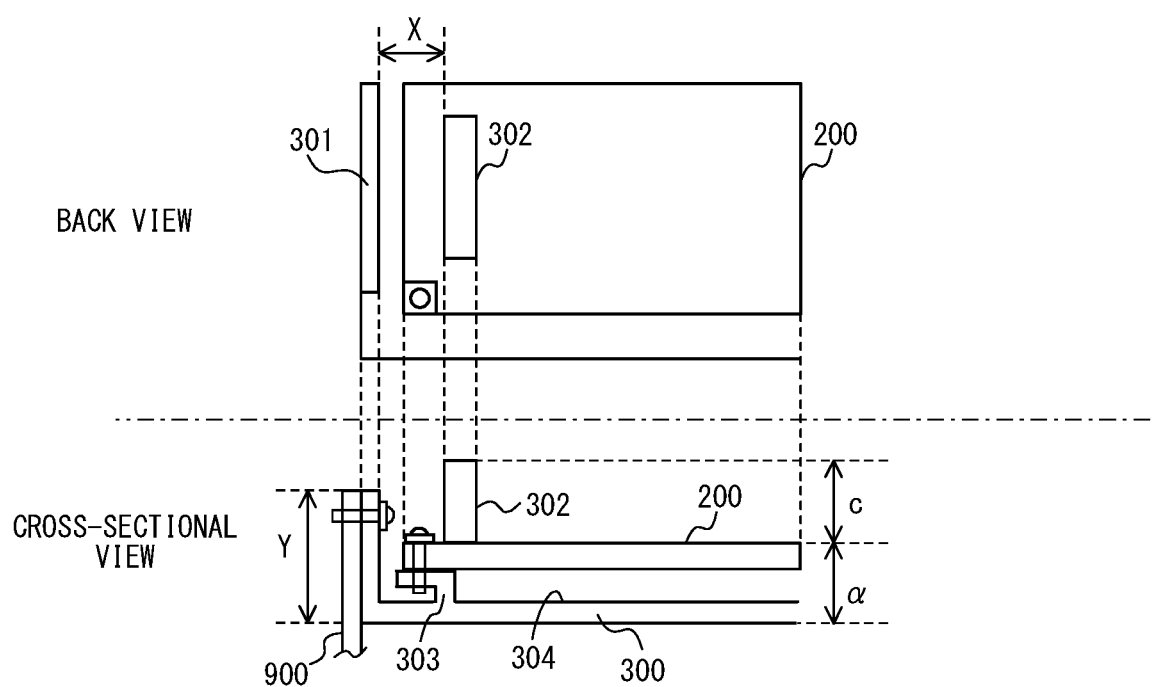
FIG. 6 shows explanatory views of a relationship between a connector and a side wall.

FIG. 6 show explanatory views of a relationship between the connector 302 of the control board 200 and the side wall 301 of the support member 300. In this case, a description is given with reference to a back view and a cross-sectional view of the control unit 250. In FIG. 6, a relationship among a distance X from the end portion of the connector 302 of the control board 200 to the side wall 301, a height Y of the side wall 301, a height C of the connector 302, and a height a from the bottom surface of the support member 300 to the upper surface of the control board 200 is indicated. In order to achieve satisfactory workability of insertion into and removal from the connector 302, it suffices that the connector 302 is located at a position higher than the side wall 301 and the height of the side wall 301 is large enough to prevent the side wall 301 from interfering with a worker's hand or an automatic machine. The side wall 301 is fixed to a mounting portion 900 on the image forming apparatus 100 side, which has its upper part located at the same height as the upper part of the side wall 301 with a fixing screw.

Figure 7:
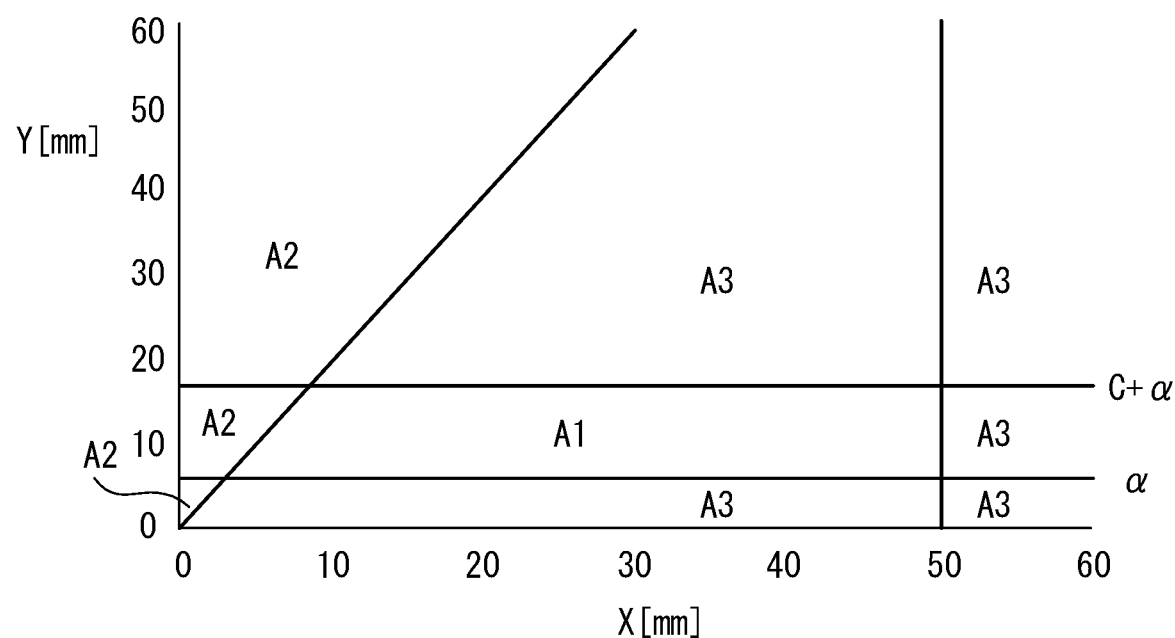
FIG. 7 is an explanatory graph for showing workability of insertion and removal.

FIG. 7 is an explanatory graph for showing workability of insertion and removal. The side wall 301 is provided for the purpose of preventing another unit (for example, the power supply unit 600 or the high-voltage unit 500) adjacent thereto from being brought into contact with the end portion of the control board 200, but adversely affects the workability of insertion into and removal from the connector 302. In order to achieve satisfactory workability of insertion into and removal from the connector 302, it is preferred that the distance X from the end portion of the connector 302 to the side wall 301 be large and the height Y of the side wall 301 be small. Meanwhile, as the distance X from the end portion of the connector 302 to the side wall 301 becomes smaller and the height Y of the side wall 301 becomes larger, the workability of insertion into and removal from the connector 302 becomes lower. In other words, the workability of insertion into and removal from the connector 302 is expressed by the following relationship between the distance X from the end portion of the connector 302 to the nearest side wall 301 from the connector 302 and the height Y of the side wall 301.

$Y < 2*X$: Satisfactory workability $Y \geq 2*X$: Poor workability

In addition, in order to achieve satisfactory workability of insertion into and removal from the connector 302 while preventing the end portion of the control board 200 from being brought into contact with another unit, the distance X from the end portion of the connector 302 to the side wall 301 and the height Y of the side wall 301 are required to have the following relationship.

$\alpha < Y < C + \alpha$ $X < 50$ mm

The specific value of the distance X from the end portion of the connector 302 to the side wall 301 is not limited to 50 mm, and may be any distance that enables interference with a worker's hand or an automatic machine to be avoided while preventing another unit from being brought into contact with the control board 200. Therefore, in order to satisfy a requirement for preventing the end portion of the control board 200 from being brought into contact with another part and a requirement for the workability of insertion into and removal from the connector 302, it suffices that the following relationship is satisfied.

$$\alpha < Y < C + \alpha$$

$$Y < 2*X (X < 50 \text{ mm})$$

That is, the height Y of the side wall 301 is larger than the height a from the bottom surface of the support member 300 to the upper surface of the control board 200, is smaller than the sum of the height a and the height C of the connector 302, and is smaller than twice the distance X from the connector 302 to the nearest side wall 301. The distance X from the connector 302 to the side wall 301 is smaller than 50 mm.

In the example of FIG. 7, in an area A1, the requirement for preventing the end portion of the control board 200 from being brought into contact with another part and the requirement for the workability of insertion into and removal from the connector 302 are satisfied. That is, the area A1 satisfies $\alpha < Y < C + \alpha$ and $Y < 2*X$. In an area A2, the requirement for the workability of insertion into and removal from the connector 302 is not satisfied. That is, the area A2 does not satisfy $Y < 2*X$. In an area A3, the requirement for preventing the end portion of the control board 200 from being brought into contact with another part is not satisfied. That is, the area A3 does not satisfy $\alpha < Y < C + \alpha$.

The support member 300 in at least one embodiment described above has a configuration in which the distance X from the end portion of the connector 302 to the side wall 301 and the height Y of the side wall 301 are appropriately set, to thereby prevent the end portion of the control board 200 from being brought into contact with another part and achieve satisfactory workability of insertion into and removal from the connector 302. Specifically, in a case where the distance X from the end portion of the connector 302 to the side wall 301 and the height Y of the side wall 301 satisfy such a relationship as indicated by the area A1 of FIG. 7, the end portion of the control board 200 is prevented from being brought into contact with another part, and satisfactory workability of insertion into and removal from the connector 302 is achieved.

The image forming apparatus 100 has been described above as an example, but at least one embodiment is also applicable to a post-processing apparatus configured to perform, for example, bookbinding, insertion, punching, and stapling, and an apparatus configured to perform predetermined processing, for example, a sheet feeding apparatus such as a deck. At least one embodiment is further applicable not only to the control board 200 but also to a support member for incorporating or mounting another board into/to the apparatus.

Modification Example of Support Member

Figure 8:
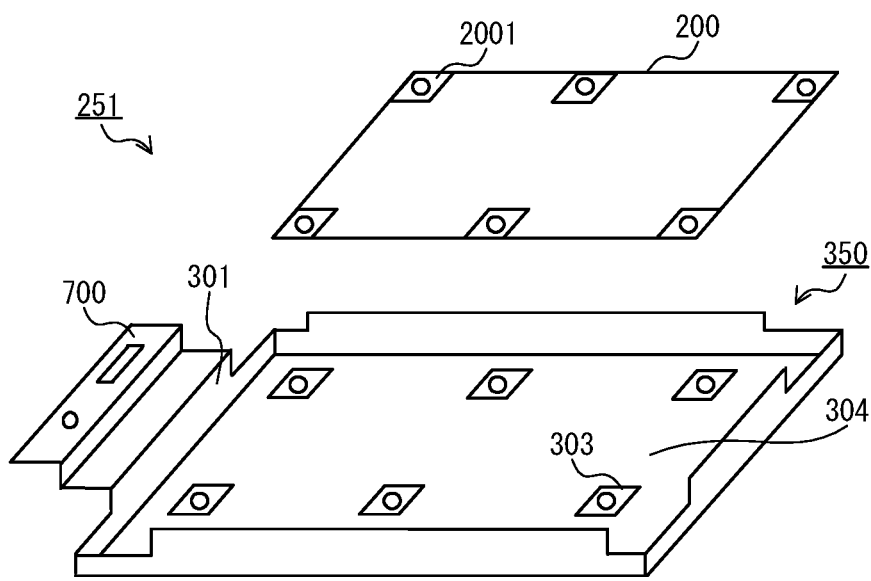
FIG. 8 is an explanatory view of a control unit in a modification example of the present disclosure.
Figure 9:
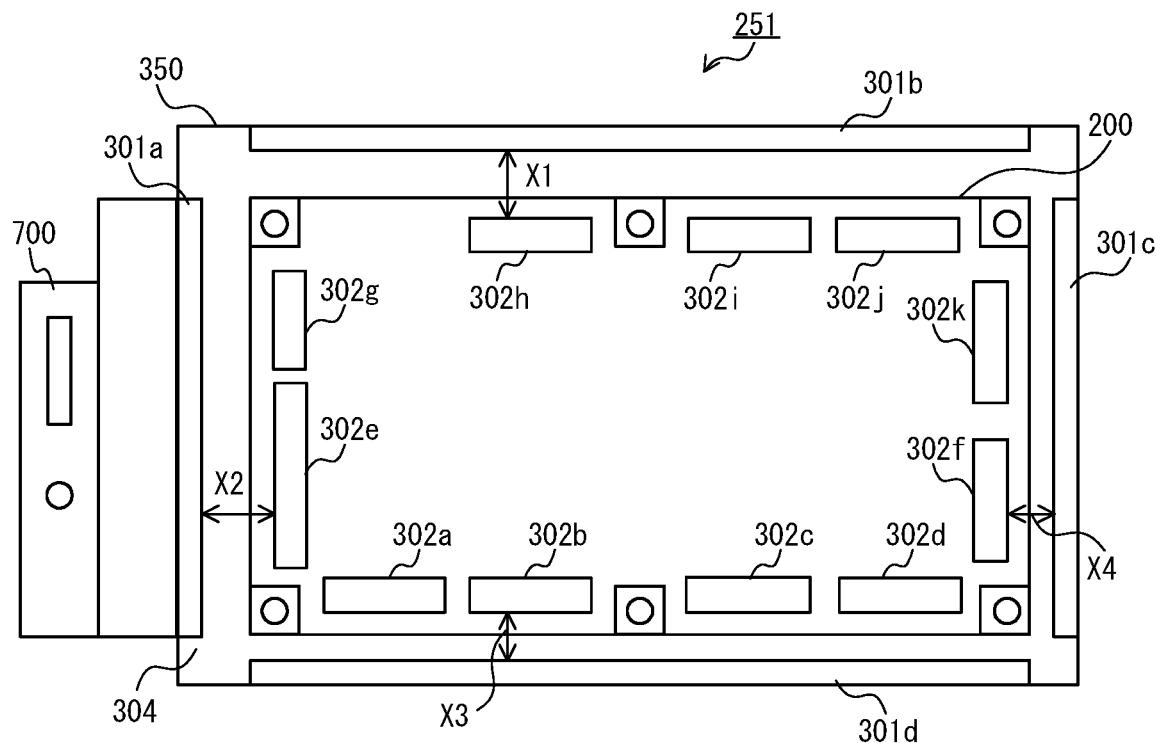
FIG. 9 is a view for illustrating a configuration of the control unit in the modification example.

FIG. 8 is an explanatory view of the control unit 251 in a modification example of the present disclosure. FIG. 9 is a view for illustrating a configuration of the control unit 251 in the modification example. When compared to the support member 300 of the control unit 250 illustrated in FIG. 4 and FIG. 5, the support member 350 illustrated in FIG. 8 and FIG. 9 further includes a fixing portion 700. The fixing portion 700 is provided to at least one of the plurality of side walls 301. The fixing portion 700 is used to fix the control unit 251 to the main body (casing) of the image forming apparatus 100.

Figure 10:
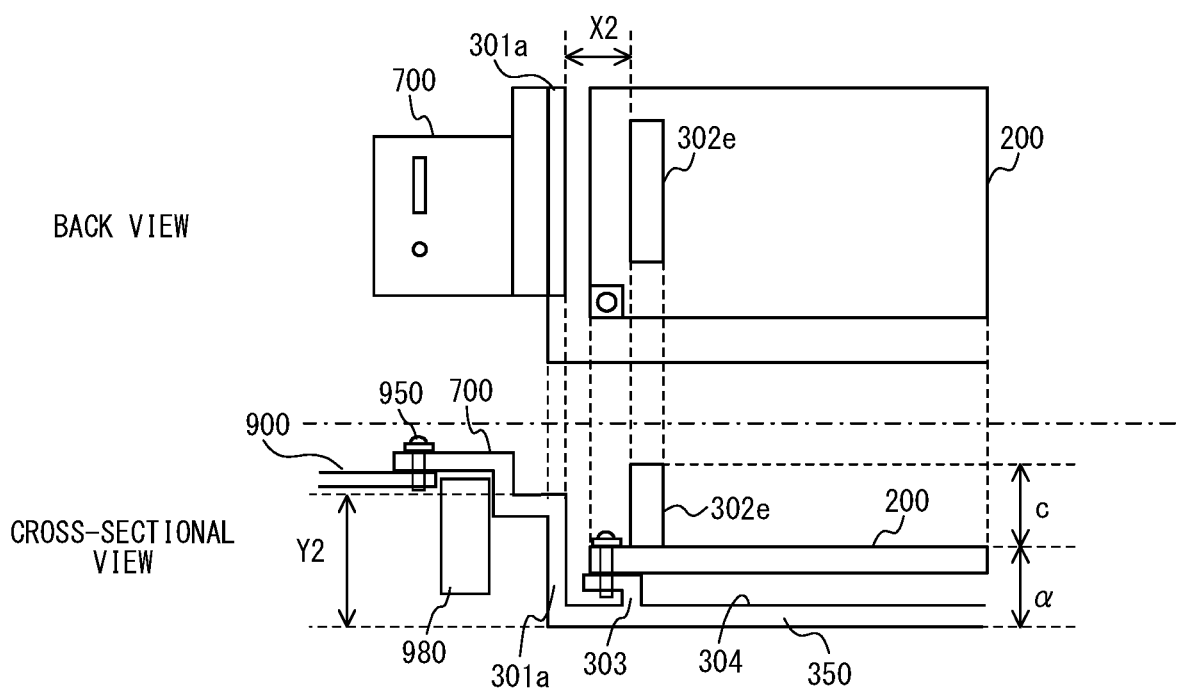
FIG. 10 shows explanatory views of a relationship between the connector and the side wall.

FIG. 10 show explanatory views of a relationship between the connector 302e of the control board 200 and the side wall 301a of the support member 350. The fixing portion 700 is provided to the side wall 301a. In the same manner as in the case of FIG. 6, a description is given with reference to a back view and a cross-sectional view of the control unit 251. In FIG. 10, a relationship among a distance X2 from the end portion of the connector 302e of the control board 200 to the side wall 301a, a height Y2 of the side wall 301a, the height C of the connector 302e, and the height a from the bottom surface of the support member 350 to the upper surface of the control board 200 is indicated.

The side wall 301a is connected to the fixing portion 700 formed of two cranks in order to avoid another component 980 provided in the vicinity. The fixing portion 700 is fixed to the mounting portion 900 on the casing of the image forming apparatus 100 with the fixing screw 950. Thus, the control board 200 is mounted to the image forming apparatus 100. In this case, the height Y2 of the side wall 301a is smaller than the height C of the connector 302e, and hence a worker's hand or an automatic machine does not interfere with the side wall 301a at the time of insertion into or removal from the connector 302e. Therefore, the worker's workability of the insertion and removal is kept satisfactory. The fixing portion 700 may also be formed unitarily with the side wall 301a, and may be formed by bending an edge portion of the side wall 301a three times.

In addition, in order to achieve satisfactory workability of insertion into and removal from the connector 302e while preventing the end portion of the control board 200 from being brought into contact with another unit, the distance X2 from the end portion of the connector 302e to the side wall 301a and the height Y2 of the side wall 301a are required to have the following relationship.

$$\alpha < Y2 < C + \alpha$$

$$X2 < 50 \text{ mm}$$

The specific value of the distance X2 from the end portion of the connector 302e to the side wall 301a is not limited to 50 mm, and may be any distance that avoids interference with a worker's hand or an automatic machine. Therefore, in order to satisfy a requirement for preventing the end portion of the control board 200 from being brought into contact with another part and a requirement for the workability of insertion into and removal from the connector 302e, it suffices that the following relationship is satisfied.

$$\alpha < Y2 < C + \alpha$$

$$Y2 < 2*X2 (X < 50 \text{ mm})$$

As long as the other side walls 301b to 301d and the connectors 302a to 302d and 302f to 302k have such a relationship as described with reference to FIG. 6 and FIG. 7, the end portion of the control board 200 is prevented from being brought into contact with another part, and satisfactory workability of insertion into and removal from the connector 302e is maintained.

The support member 350 described above includes the fixing portion 700, to thereby function as a fixing tool with respect to a nearby member. Even in this case, the end portion of the control board 200 is prevented from being brought into contact with another part, and the workability of insertion into and removal from the connector 302 becomes satisfactory. Consequently, at least one embodiment of the present disclosure facilitates the insertion into and removal from the connector 302 while preventing the control board 200 mounted to the support member 350 from hitting an apparatus main body during mounting work of mounting the control board 200 to the apparatus main body.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-103501, filed Jun. 3, 2019, which is hereby incorporated by reference herein in its entirety.

What is claimed is:

1. An image forming apparatus, comprising:
   an image forming unit configured to form an image on a recording material;
   a fixing unit configured to fix the image to the recording material;
   a control board configured to electrically connect to the fixing unit via a connector;
   a support member, wherein the control board is attached to the support member; and
   a mounting portion, wherein the support member is attached to the mounting portion,
   wherein the support member includes a side wall, and
   wherein a height of the side wall is:
      smaller than twice a distance between the side wall and the connector on the control board under a state in which the control board is attached to the support member;
      larger than a first height, which is a height from a bottom surface of the support member to an upper surface of the control board, and
      smaller than a second height obtained by adding a height of the connector to the first height.

2. The image forming apparatus according to claim 1, wherein the support member includes an attachment surface to which the control board is to be attached, and has the side wall formed on at least one side of the attachment surface.

3. The image forming apparatus according to claim 2, wherein the height of the side wall is larger than the upper surface of the control board exhibited in a case where the control board is attached to the attachment surface, and is smaller than the height of the connector.

4. The image forming apparatus according to claim 2, wherein the distance between the side wall and the connector is smaller than 50 mm.

5. The image forming apparatus according to claim 2,
   wherein the control board including a plurality of connectors is attached to the attachment surface, and
   wherein the height of the side wall is smaller than twice a distance from the side wall to a nearest one of the plurality of connectors from the side wall.

6. The image forming apparatus according to claim 1, wherein the side wall includes a fixing portion for mounting the support member to the mounting portion.

7. The image forming apparatus according to claim 6, wherein a height of the fixing portion is larger than the height of the connector.

8. The image forming apparatus according to claim 6, wherein the fixing portion is formed unitarily with the side wall.

9. An image forming apparatus, comprising:
   an image forming unit configured to form an image on an image bearing member;
   a transfer unit configured to transfer the image on the image bearing member onto a recording material;
   a fixing unit configured to fix the image to the recording material;
   a motor configured to rotate the image bearing member;
   a control board configured to electrically connect to the motor via a connector;
   a support member, wherein the control board is attached to the support member; and
   a mounting portion, wherein the support member is attached to the mounting portion,
   wherein the support member includes a side wall, and
   wherein a height of the side wall is:
      smaller than twice a distance between the side wall and the connector on the control board under a state in which the control board is attached to the support member;
      larger than a first height, which is a height from a bottom surface of the support member to an upper surface of the control board; and
      smaller than a second height obtained by adding a height of the connector to the first height.

* * * * *